(12) United States Patent
Natarajan et al.

(10) Patent No.: US 10,149,131 B2
(45) Date of Patent: Dec. 4, 2018

(54) COMPRESSIVE SENSING FOR POWER EFFICIENT DATA AGGREGATION IN A WIRELESS SENSOR NETWORK

(71) Applicant: INTEL CORPORATION, Santa Clara, CA (US)

(72) Inventors: Venkat Natarajan, Bangalore (IN); Apoorv Vyas, Bangalore (IN); Kumar Ranganathan, Bangalore (IN); Jose Joy, Kottayam (IN); Harshpal Singh, Jalandhar (IN)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 15/414,171

(22) Filed: Jan. 24, 2017

(65) Prior Publication Data

US 2018/0213348 A1    Jul. 26, 2018

(51) Int. Cl.
*H04W 4/70* (2018.01)
*H04L 29/08* (2006.01)
(Continued)

(52) U.S. Cl.
CPC .............. *H04W 4/70* (2018.02); *H04L 67/12* (2013.01); *H04W 52/0203* (2013.01); *H03M 7/3062* (2013.01)

(58) Field of Classification Search
CPC ... H04W 4/70; H04W 52/0203; H04W 24/08; H04W 84/18; H04L 67/12; H04L 41/145; H04L 43/024; H03M 7/3062
See application file for complete search history.

(56) References Cited

U.S. PATENT DOCUMENTS 9,773,330 B1 * 9/2017 Douglas ................ G06T 11/206
2008/0250875 A1 * 10/2008 Khosla ............. G01N 35/00871
73/863
(Continued)

FOREIGN PATENT DOCUMENTS

WO    2011011811    2/2011

OTHER PUBLICATIONS

International Search Report for International Patent Application No. PCT/US2018/014866, dated Jul. 2, 2018, 4 pages.
(Continued)

*Primary Examiner* — Paul H Masur
*Assistant Examiner* — Michael K Phillips
(74) *Attorney, Agent, or Firm* — Finch & Maloney PLLC

(57) ABSTRACT

Techniques are provided for compressive sensing (CS) in a sensor network, for improved power efficiency. A methodology implementing the techniques according to an embodiment includes determining a state of a sensor network, based on a calculated statistic of sampled data values generated by one or more sensors in the network, and on anomaly indications generated by the one or more sensors. The method further includes calculating a CS sampling schedule based on the determined state and further based on a sparse signal recovery algorithm. The method further includes broadcasting the CS schedule to the one or more sensors. The CS schedule includes a sensor identification, sampling frequency, and sampling time offset for each sensor to be sampled. The method further includes updating the state of the sensor network and the CS schedule, based on updated data values generated by the one or more sensors in accordance with the sampling schedule.

25 Claims, 7 Drawing Sheets

(51) Int. Cl.
*H04W 52/02* (2009.01)
*H03M 7/30* (2006.01)

(56) References Cited

U.S. PATENT DOCUMENTS

| | | | |
|---|---|---|---|
| 2008/0255911 A1* | 10/2008 | Khosla | G01S 5/0294 |
| | | | 705/7.38 |
| 2012/0002564 A1 | 1/2012 | Sexton et al. | |
| 2012/0063641 A1 | 3/2012 | Venkatesh et al. | |
| 2012/0128057 A1 | 5/2012 | Daecke et al. | |
| 2013/0070624 A1* | 3/2013 | Nguyen | H03M 7/30 |
| | | | 370/252 |
| 2015/0163210 A1* | 6/2015 | Meyers | H04W 4/70 |
| | | | 726/4 |
| 2015/0334580 A1* | 11/2015 | Niskanen | H04L 12/12 |
| | | | 370/252 |
| 2016/0044439 A1 | 2/2016 | Mittal et al. | |
| 2017/0295253 A1* | 10/2017 | Siegel | H04L 41/145 |

OTHER PUBLICATIONS

Written Opinion of the International Searching Authority for International Patent Application No. PCT/US2018/014866, dated Jul. 2, 2018, 5 pages.

Giorgio, Q. et al., "On the interplay between routing and signal representation for compressive sensing in wireless sensor networks", Research Gate, Conference Paper, Mar. 2009, 10 pages.

Chong, L. et al., "Compressive data gathering for large-scale wireless sensor networks", ACM, 2009, 12 pages.

Quer, Giorgio, et al., "On the interplay between routing and signal representation for compressive sensing in wireless sensor networks", Information Theory and Applications Workshop, 2009, 10 pages.

Luo, Chong, et al., "Compressive data gathering for large-scale wireless sensor networks", Proceedings of the 15th annual international conference on Mobile computing and networking, ACM, 2009, pp. 145-156.

\* cited by examiner

COMPRESSIVE SENSING FOR POWER EFFICIENT DATA AGGREGATION IN A WIRELESS SENSOR NETWORK

BACKGROUND

The "Internet of Things," also referred to as the IoT, is an inter-connected network of smart devices, vehicles, homes, factories, etc., that may include processors, software, sensors, and electronically controlled mechanisms. Devices on the IoT can collect and share data, and may, in some cases, be remotely controlled. Wireless sensor networks are becoming increasingly common to support IoT applications. The sensors in these networks can provide real-time monitoring or measurement of environmental variables, for example temperature, pressure, humidity, and/or motion over extended durations of weeks, months, or years. Unfortunately, portable sensors used in these networks typically employ disposable batteries that can drain quickly when operated continuously for prolonged periods. This is particularly true when frequent transmissions of data are required between the sensor and a data collecting node or network gateway.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1:
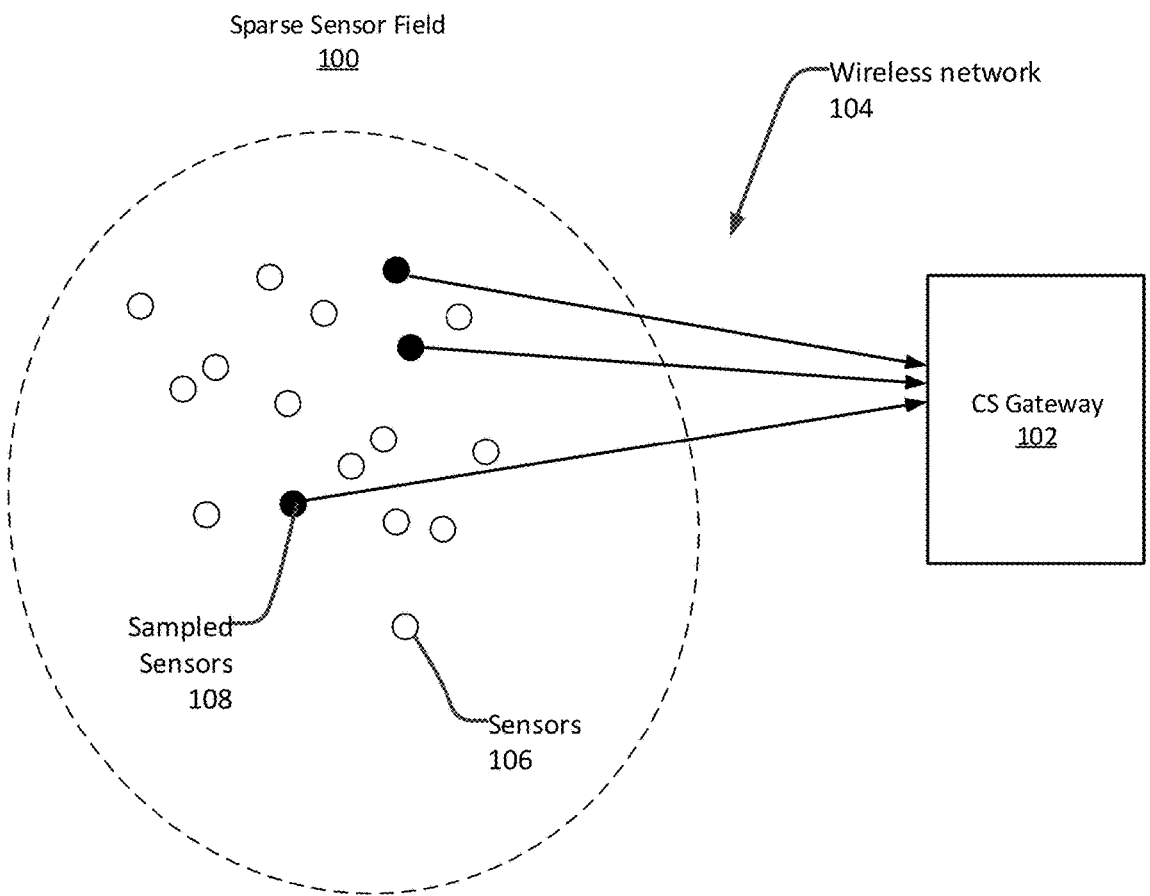
FIG. 1 illustrates an implementation of a compressive sensing (CS) gateway for a network of sensors, configured in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Generally, this disclosure provides compressive sensing (CS) techniques for power efficient data aggregation in a wireless sensor network. The sensors in these networks are configured to provide real-time monitoring of conditions of interest over extended periods of time (e.g., weeks, months, or years) with relatively little or no operator attention. Power efficient operation, including reduced transmission times from the sensors to the network gateway, is important to conserve battery life at the sensors. The disclosed CS techniques exploit characteristics of the sensor field, including sparsity as will be explained below, to implement a sensor sampling schedule that avoids redundant transmissions of data, according to an embodiment. The disclosed CS techniques also provide for the detection of anomalous events in the sensor field to allow the sampling schedule to be adjusted accordingly, such that sensors associated with the anomalies can be sampled at a higher rate. The resulting hybrid sampling scheme of some such embodiments allows for non-anomalous sensors to be sampled at a relatively low and energy-efficient CS sampling rate while anomalous sensors are sampled at higher rates.

The disclosed techniques can be implemented, for example, in a computing system or a software product executable or otherwise controllable by such systems, although other embodiments will be apparent. The system or product is configured to provide compressive sensing (CS) in a sensor network, for improved power efficiency. In accordance with an embodiment, the method includes sampling data values generated by each of the sensors in the network, and determining a state of the sensor network, based on a calculated statistic of the data values and on anomaly indications generated by the sensors. The method further includes calculating a CS sampling schedule based on the determined state and further based on a sparse signal recovery algorithm, such as, for example, an L1-norm minimization. The method further includes broadcasting the CS schedule to the sensors. The CS schedule includes, for example, a sensor identification, sampling frequency, and sampling time offset for each of the sensors to be sampled. In some such embodiments, the method further includes updating the state of the sensor network and the CS schedule, based on new data values generated by the sensors in accordance with the sampling schedule.

As will be appreciated, the techniques described herein may allow for improved, energy-efficient, sensor sampling based on spatio-temporal properties of the sensor field, compared to existing methods that continuously sample all sensors with resulting high power consumption. In some embodiments, as few as 5 to 10 percent of the sensors may be regularly sampled, resulting in a compression ratio of 10 to 20, and a power saving of approximately 80 percent. The disclosed techniques can be implemented on a broad range of platforms including network gateways. These techniques may further be implemented in hardware or software or a combination thereof.

FIG. 1 illustrates an implementation of a compressive sensing (CS) gateway for a network of sensors, configured in accordance with certain embodiments of the present disclosure. A sparse sensor field 100 is shown to include a number of sensors 106, configured in a star network topology (although other configurations are possible). A sensor field is considered sparse if the signal information provided by those sensors may be represented by a relatively small number of coefficients in some mathematical basis. For example, in the Discrete Fourier transform domain, only a few coefficients of sparse sensor data will be significant while the remaining coefficients will be close to zero indicating that changes in the sensor values are not abrupt. Said differently, a sparse sensor field is one in which the data values are well-correlated in some basis.

A subset of these sensors 108 will be sampled, by network gateway 102 which is configured to perform compressive sensing. The subset 108 will be determined by a compressive sensing schedule, which may be dynamically adjusted over time, and is configured to exploit the sparseness properties of the sensor field 100, as will be explained in greater detail below.

Figure 2:
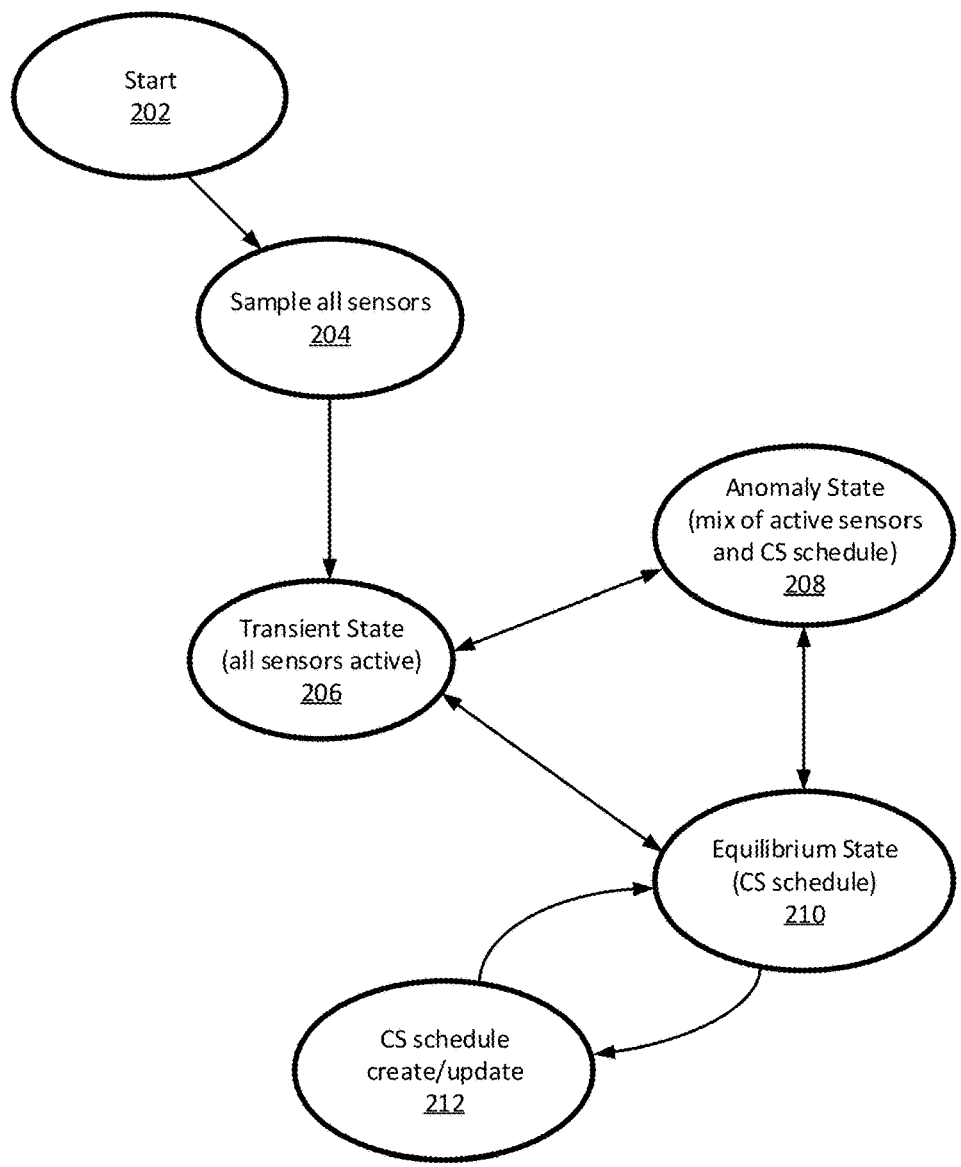
FIG. 2 is a state diagram associated with operation of the CS gateway, configured in accordance with certain embodiments of the present disclosure.

FIG. 2 is a state diagram 200 associated with operation of the CS gateway 102, configured in accordance with certain embodiments of the present disclosure. The CS gateway 102 is configured to determine a state of the network or sensor field 100 and to adjust operations and scheduling accordingly. In some embodiments, the sensor network states (also referred to as system states) include a transient state, an equilibrium state, and an anomalous state. Upon start up or initialization 202, the sensor field is set to a transient state 206, in which all sensors are active and transmitting data at a pre-determined rate. It will be understood that the use of the term "all sensors" is used to indicate a relatively large majority, if not in fact all, of the sensors deployed in the network, as there may be situations in which some few sensors are excluded for reasons beyond the scope of this disclosure.

The sensor data is monitored in the transient state, and when the data reaches an equilibrium point, a CS schedule is created or updated 212, as will be explained below, and the system enters an equilibrium state 210. In the equilibrium state 210, a first subset of the sensors transmits data values based on the CS schedule (as will be explained below), and a second, typically larger subset, of the sensors remain inactive to conserve power. If an anomaly is detected at one or more of the sensors (whether active or inactive), the system enters an anomaly state 208. In the anomaly state, a first subset of the sensors transmits data values based on the CS schedule, a second, typically larger subset, of the sensors remain inactive to conserve power, and a third, typically smaller subset of the sensors (e.g., those that are indicating an anomalous condition) transmits data values at a pre-determined higher rate.

The system is configured to switch between states 206, 208 and 210 based on changing conditions. For example, if a technician or operator addresses the problems associated with anomalous sensors, the state may switch from anomalous 208 back to equilibrium 210. Additionally, in some embodiments, the system may periodically switch back to transient state 206 to update the CS schedule based on a new/current complete set of sensor measurements. The CS schedule update interval may be selected based on the application and the expected variance of the sensor field over time. For example, a critical application and/or a rapidly varying sensor field may require more frequent schedule updates.

Figure 3:
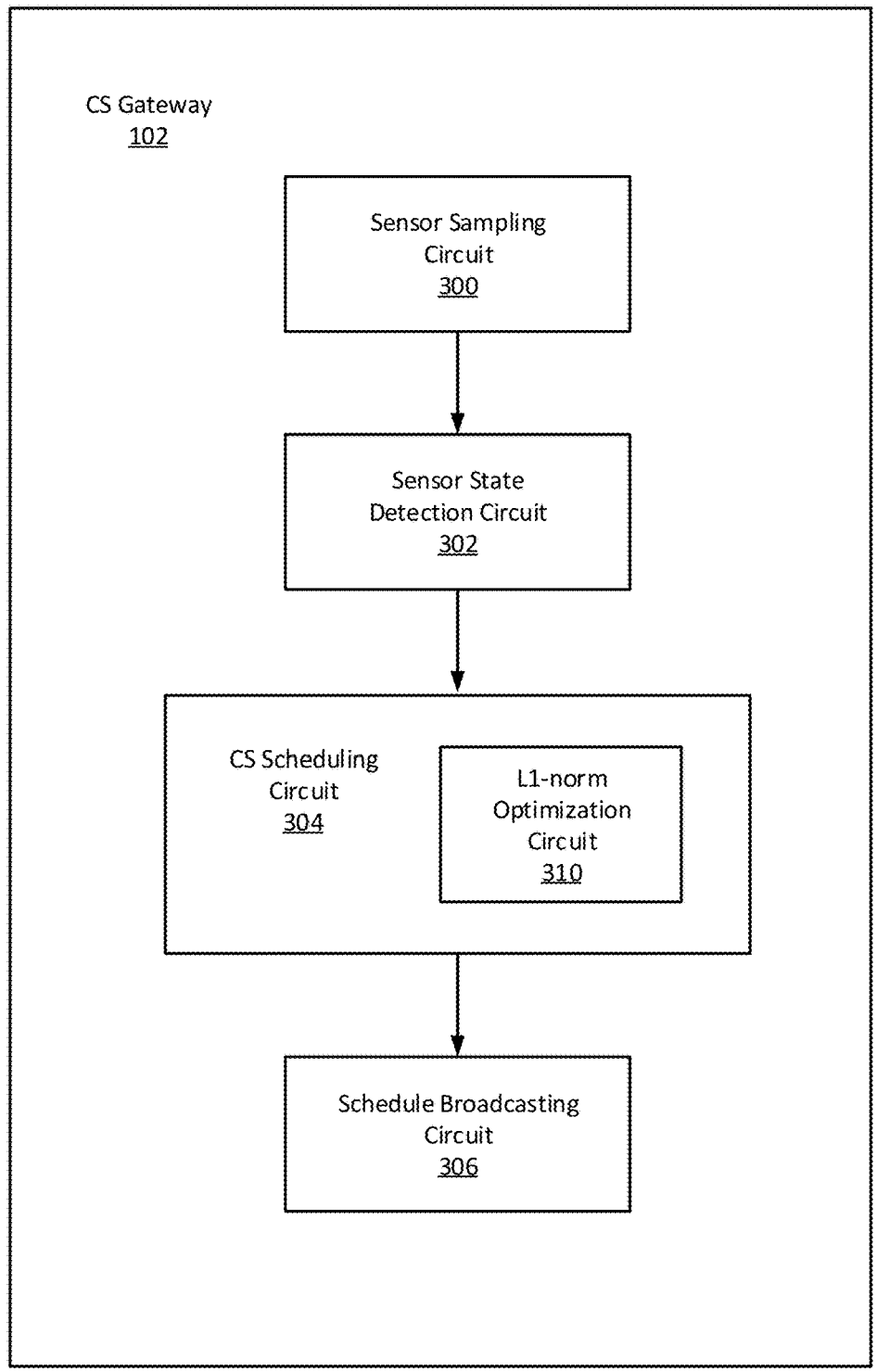
FIG. 3 is a block diagram of CS gateway, configured in accordance with certain embodiments of the present disclosure.

FIG. 3 is a block diagram of CS gateway 102, configured in accordance with certain embodiments of the present disclosure. At a high level, the CS gateway 102, or other data aggregation system, is configured to generate a CS schedule for sensors 106 and to collect data according to that schedule. The CS gateway 102 is shown to include sensor sampling circuit 300, sensor state detection circuit 302, CS scheduling circuit 304, schedule broadcasting circuit 306, and L1-norm optimization circuit 310.

Sensor sampling circuit 300 is configured to sample data values generated by each of the sensors 106 in the sparse sensor field 100 through a network connection. In some embodiments, the sensor network 104 is a wireless network and the sensors are battery powered.

Sensor state detection circuit 302 is configured to determine a state of the sensor network, based on a calculated statistic of the data values and further based on anomaly indications generated by the sensors. The sensor network states include an equilibrium state, a transient state, and an anomalous state, as described above. In some embodiments, the calculated statistic may be the standard deviation or variance of the sensor data computed over a sliding window, as explained below in connection with FIG. 4. In some embodiments, the sensors are configured to generate the anomaly indication autonomously, based on detection of a data value which exceeds a selected threshold value or falls outside of a range of acceptable values for that sensor. In some embodiments, other suitable anomaly criteria may be employed.

CS scheduling circuit 304 is configured to calculate a CS sampling schedule based on the determined state and further based on results of a sparse signal recovery algorithm. The CS schedule specifies which sensors are to collect and transmit data, and how often. For example, the CS schedule may include sensor IDs for the sensors which are designated to be active, as well as a time offset and sampling frequency to describe the timing of data measurement and transmission. The sparse signal recovery algorithm generally determines a minimum number of sensor nodes, for participation in measurement and transmission, which can accurately represent the entire sensor field. Under equilibrium conditions, which are typical, this number of sensors is a relatively small fraction of the total number of sensors, resulting in significant power savings under most conditions. Additionally, in some embodiments, the CS schedule sequences the measurements, such that all sensors are periodically sampled to provide the coverage required to detect anomalous events.

In some embodiments, CS scheduling circuit 304 includes an L1-norm optimization circuit 310 which is configured to execute the sparse signal recovery algorithm based on an L1-norm minimization over a sparse basis, such as, for example, a Discrete Cosine Transform (DCT). In some embodiment, the CS sampling schedule is calculated using other known techniques, in light of the present disclosure.

Schedule broadcasting circuit 306 is configured to broadcast the CS sampling schedule to the network sensors. In some embodiments, the CS sampling schedule includes a sensor identification, a sampling frequency, and a sampling time offset for each of the sensors to be sampled. The sensors are configured to follow the CS sampling schedule unless and until they detect an anomaly event. Anomaly events cause spikes in the data which reduce sparsity of the sensor field. Upon detection of an anomaly event, the sensor may provide a signal to the CS gateway 102 indicating the anomaly condition, and autonomously increase the sampling and transmission rate to a pre-determined anomaly sampling rate to adaptively reconfigure the schedule.

The state detection circuit 302 is further configured to update the state of the sensor network, for example in response to detection or removal of an anomaly condition, and/or based on statistics of new data values generated by the sensors over time in accordance with the CS sampling schedule. The CS scheduling circuit 304 is further configured to update the CS sampling schedule, based on new data values generated by the sensors and/or at periodic predetermined intervals. Updated state changes and updated schedules may ensure that all sensors are eventually sampled within a selected time duration.

Figure 4:
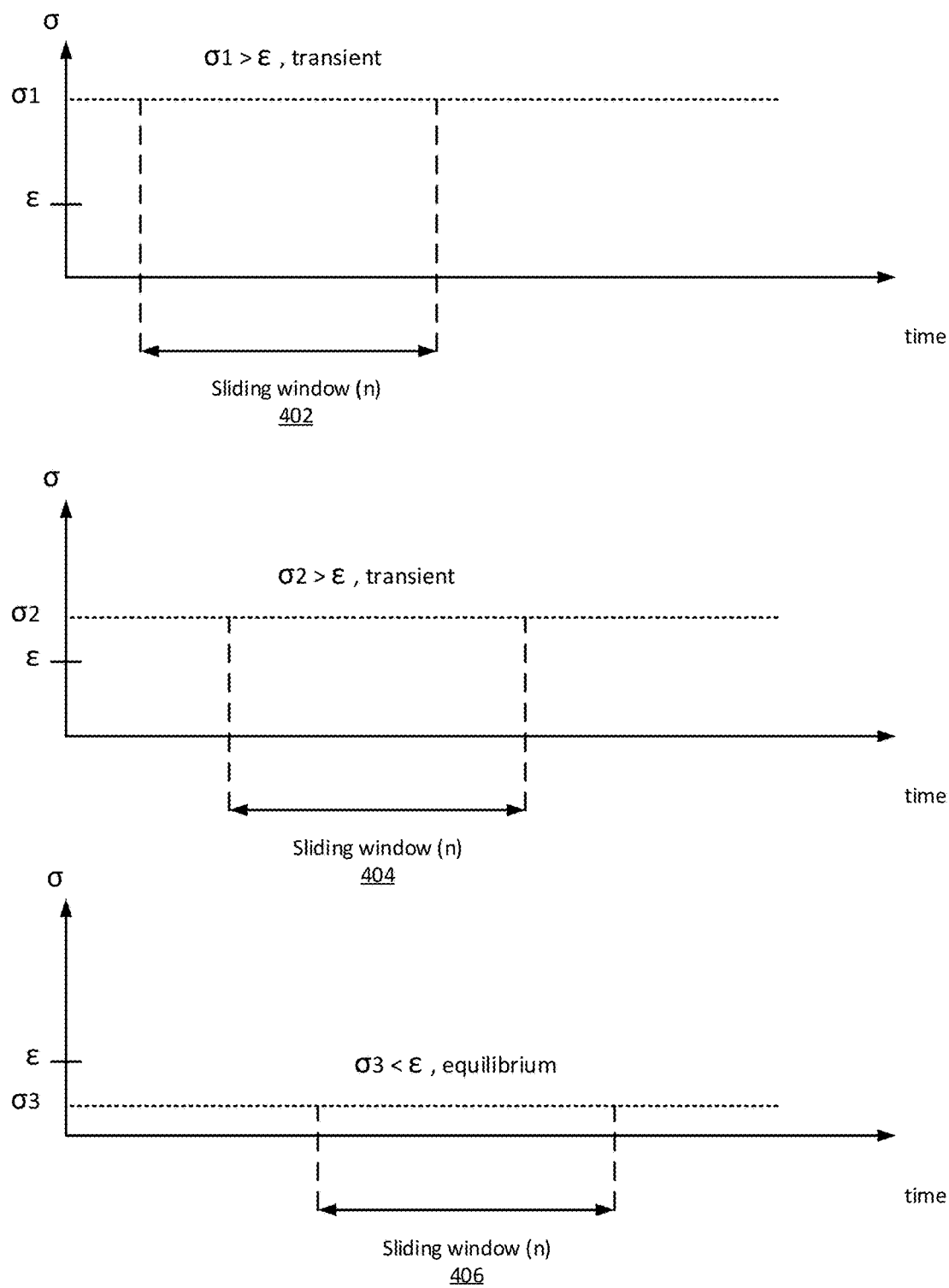
FIG. 4 illustrates sliding window statistical measurements, in accordance with certain embodiments of the present disclosure.

FIG. 4 illustrates sliding window statistical measurements, in accordance with certain embodiments of the present disclosure. A sliding window of length n is applied to data samples from a given sensor at a number of instances in time 402, 404, 406. A standard deviation $\sigma$, (or variance or other suitable statistic) is calculated for each window and compared to a threshold value $\varepsilon$. When the value of the statistic is greater than the threshold, 402 and 404, the state remains at, or is set to, the transient state. When the value of the statistic falls below the threshold, 406, the state is set to the equilibrium state, assuming the absence of any anomaly indicators.

Figure 5:
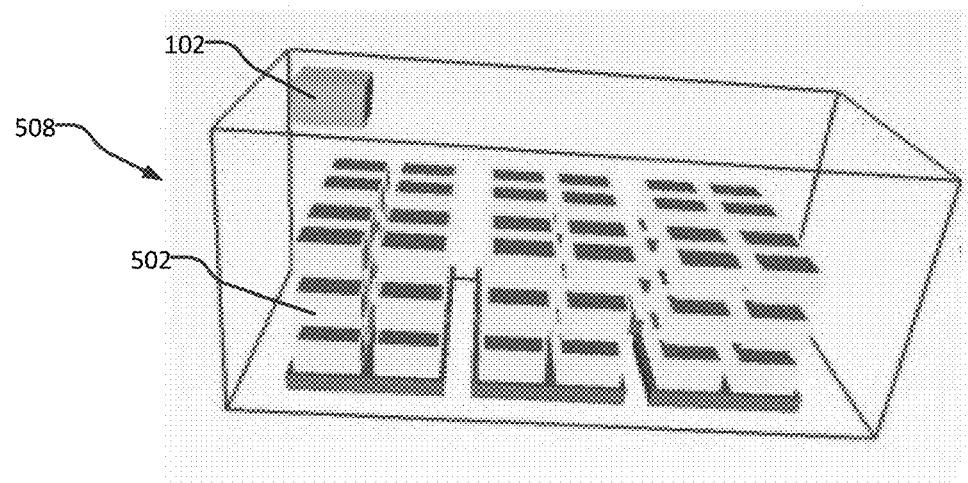
FIG. 5 illustrates an application of compressive sensing to a cold storage sensor network, in accordance with certain embodiments of the present disclosure.
Figure 5:
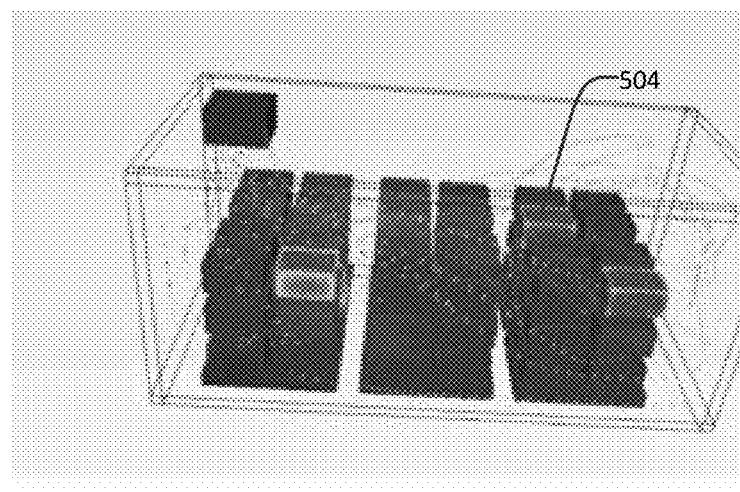
Figure 5:
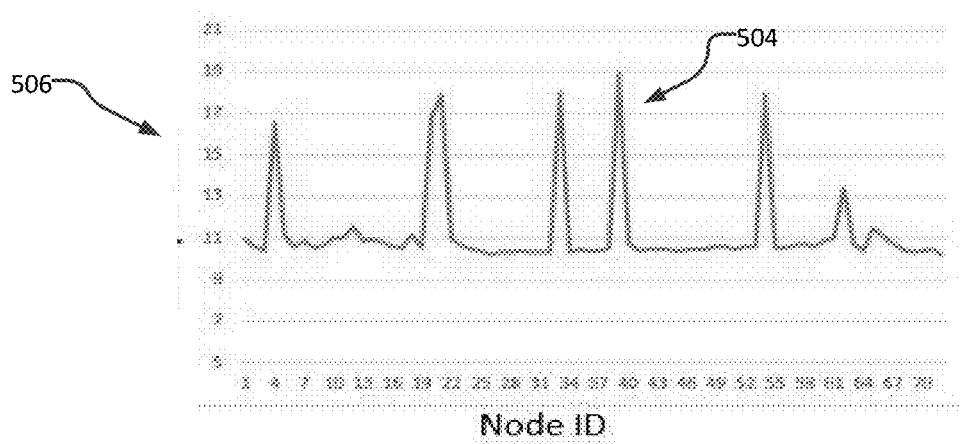

FIG. 5 illustrates an example application of compressive sensing to a cold storage sensor network, in accordance with certain embodiments of the present disclosure. A number of cold storage units 502 (e.g., refrigerators or freezers) are shown at a site or facility 508. Each unit is monitored by a temperature sensor which is configured to transmit temperature measurements over a wireless network to a CS gateway 102. The gateway broadcasts a CS schedule to the units (or network nodes) and the sensors collect and transmit the data in accordance with that schedule, as described previously. Also, shown in this example, several of the units enter an anomalous state 504 (e.g., an over temperature condition). A plot 506 of the temperature readings versus node ID is shown. The anomalies are visible as spikes on the plot which will result in higher sampling rates for those sensors until the condition is corrected.

Methodology

Figure 6:
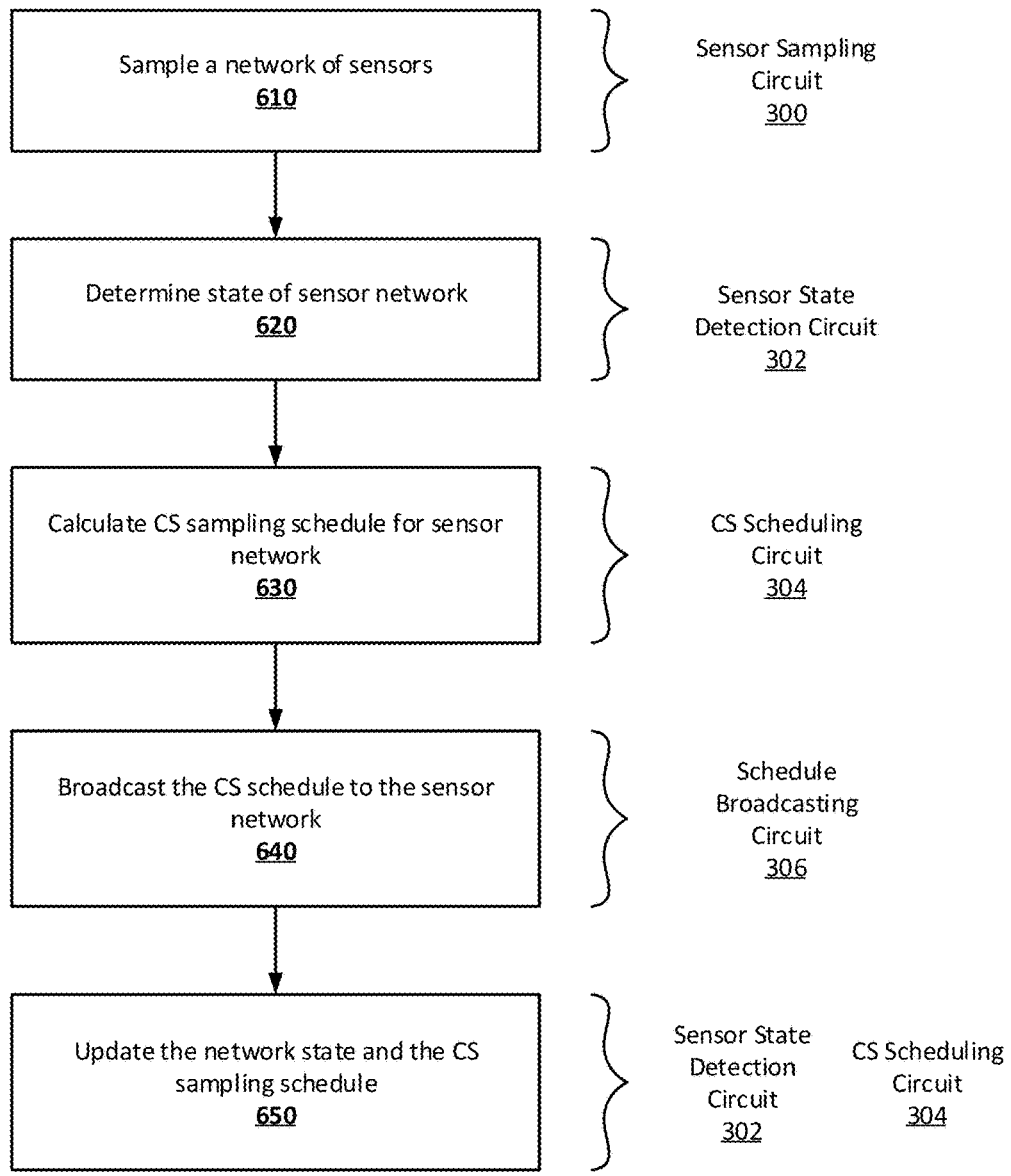
FIG. 6 is a flowchart illustrating a methodology for compressive sensing, in accordance with certain embodiments of the present disclosure.

FIG. 6 is a flowchart illustrating an example method 600 for compressive sensing, in accordance with certain embodiments of the present disclosure. As can be seen, example method 600 includes a number of phases and sub-processes, the sequence of which may vary from one embodiment to another. However, when considered in the aggregate, these phases and sub-processes form a process for compressive sensing in accordance with certain of the embodiments disclosed herein. These embodiments can be implemented, for example using the system architecture illustrated in FIG. 2 as described above. However other system architectures can be used in other embodiments, as will be apparent in light of this disclosure. To this end, the correlation of the various functions shown in FIG. 6 to the specific components illustrated in the other figures is not intended to imply any structural and/or use limitations. Rather, other embodiments may include, for example, varying degrees of integration wherein multiple functionalities are effectively performed by one system. For example, in an alternative embodiment a single module can be used to perform all of the functions of method 600. Thus, other embodiments may have fewer or more modules and/or sub-modules depending on the granularity of implementation. In still other embodiments, the methodology depicted can be implemented as a computer program product including one or more non-transitory machine readable mediums that when executed by one or more processors cause the methodology to be carried out. Numerous variations and alternative configurations will be apparent in light of this disclosure.

As illustrated in FIG. 6, in one embodiment, method 600 for compressive sensing commences by sampling a network of sensors, at operation 610. As an initialization operation, all or most of the sensors in the network are sampled to obtain data values or measurements. Next, at operation 620, the state of the sensor network is determined, based on a calculated statistic of the sensor data values and further based on any anomaly indications that may be generated by the sensors. In some embodiments, the statistics may include a standard deviation or variance of the data from each sensor, for example during a sliding window of time, as previously described.

At operation 630, a compressive sensing (CS) sampling schedule is calculated based on the determined state of the network and further based on an application of a sparse signal recovery algorithm to the collected sensor data. In some embodiments, the sparse signal recovery algorithm may include an L1-norm minimization performed over a sparse basis, such as, for example, a Discrete Cosine Transform (DCT). In some embodiments, any other known sparse basis may be used, in light of the present disclosure.

At operation 640, the CS sampling schedule is broadcast to the network of sensors. The sampling schedule includes identification of sensors to be active under the schedule, and a sampling frequency and time offset for each of the sensors to be sampled (e.g., the active sensors).

At operation 650, the state of the sensor network, and/or the CS sampling schedule, are updated based on new data values generated by the sensors over time and in accordance with the CS sampling schedule. The state of the sensor network may be at least one of an equilibrium state, a transient state, and an anomalous state, as previously described.

Of course, in some embodiments, additional operations may be performed, as previously described in connection with the system. For example, each sensor may generate an anomaly indication based on detection of data values from that sensor exceeding a selected threshold range, or based on detection of any other suitable anomalous condition.

In some embodiments, when the network is determined to be in the equilibrium state, a first subset of the sensors transmit data values based on the CS schedule, and a second, typically larger subset, of the sensors remain inactive to conserve power. In contrast, when the network is determined to be in the transient state, all or most of the sensors transmit data values at a pre-determined rate. Furthermore, when the network is determined to be in the anomalous state, most of the sensors either transmit data values based on the CS schedule or remain inactive, while the anomalous sensors transmit data values at a pre-determined, and typically higher, rate.

Example System

Figure 7:
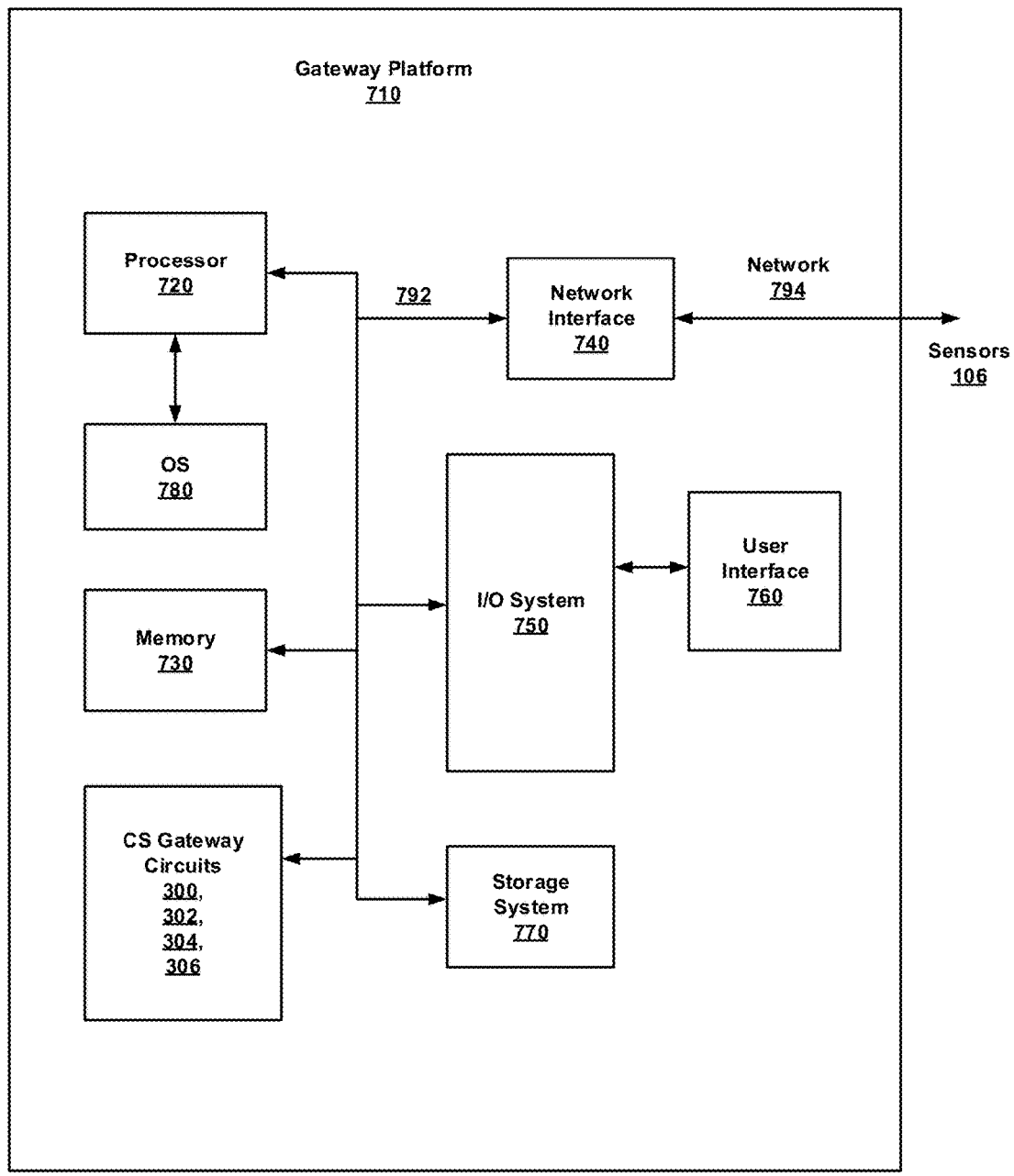
FIG. 7 is a block diagram schematically illustrating a gateway platform to perform compressive sensing, configured in accordance with certain embodiments of the present disclosure.

FIG. 7 illustrates an example system 700 to perform compressive sensing, configured in accordance with certain embodiments of the present disclosure. In some embodiments, system 700 comprises a gateway platform 710 which may host, or otherwise be incorporated into personal computer, workstation, server system, laptop computer, ultra-laptop computer, tablet, touchpad, portable computer, hand-held computer, palmtop computer, personal digital assistant (PDA), cellular telephone, combination cellular telephone and PDA, smart device (for example, smartphone or smart tablet), mobile internet device (MID), messaging device, data communication device, and so forth. Any combination of different devices may be used in certain embodiments.

In some embodiments, platform 710 may comprise any combination of a processor 720, a memory 730, CS gateway circuits 300, 302, 304, and 306, a network interface 740, an input/output (I/O) system 750, a user interface 760, and a storage system 770. As can be further seen, a bus and/or interconnect 792 is also provided to allow for communication between the various components listed above and/or other components not shown. Platform 710 can be coupled to a network 794 through network interface 740 to allow for communications with sensors 106, other computing devices, platforms, or resources. Other componentry and functionality not reflected in the block diagram of FIG. 7 will be apparent in light of this disclosure, and it will be appreciated that other embodiments are not limited to any particular hardware configuration.

Processor 720 can be any suitable processor, and may include one or more coprocessors or controllers, such as an audio processor or a graphics processing unit or a sensor hub processor, to assist in control and processing operations associated with system 700. In some embodiments, the processor 720 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 720 may be implemented as a complex instruction set computer (CISC) or a reduced instruction set computer (RISC) processor. In some embodiments, processor 720 may be configured as an x86 instruction set compatible processor.

Memory 730 can be implemented using any suitable type of digital storage including, for example, flash memory and/or random access memory (RAM). In some embodiments, the memory 730 may include various layers of memory hierarchy and/or memory caches as are known to those of skill in the art. Memory 730 may be implemented as a volatile memory device such as, but not limited to, a RAM, dynamic RAM (DRAM), or static RAM (SRAM) device. Storage system 770 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 770 may comprise technology to increase the storage performance enhanced protection for valuable digital media when multiple hard drives are included.

Processor 720 may be configured to execute an Operating System (OS) 780 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with system 700, and therefore may also be implemented using any suitable existing or subsequently-developed platform.

Network interface circuit 740 can be any appropriate network chip or chipset which allows for wired and/or wireless connection between other components of computer system 700 and/or network 794, thereby enabling system 700 to communicate with sensors 106, other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 750 may be configured to interface between various I/O devices and other components of computer system 700. I/O devices may include, but not be limited to, user interface 760. User interface 760 may include devices (not shown) such as a display element, touchpad, keyboard, mouse, microphone, and speaker, etc. I/O system 750 may include a graphics subsystem configured to perform processing of images for rendering on a display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 720 or any chipset of platform 710.

It will be appreciated that in some embodiments, the various components of the system 700 may be combined or integrated in a system-on-a-chip (SoC) architecture. In some embodiments, the components may be hardware components, firmware components, software components or any suitable combination of hardware, firmware or software.

CS gateway circuits 300, 302, 304, and 306 are configured to provide compressive sensing schedules for a sensor network to reduce power consumption of the sensors, as described previously. CS gateway circuits 300, 302, 304, and 306 may include any or all of the components illustrated in FIG. 2, as described above. CS gateway circuits 300, 302, 304, and 306 can be implemented or otherwise used in conjunction with a variety of suitable software and/or hardware that is coupled to or that otherwise forms a part of platform 710. These circuits can additionally or alternatively be implemented or otherwise used in conjunction with user I/O devices that are capable of providing information to, and receiving information and commands from, a user.

In some embodiments, these circuits may be installed local to system 700, as shown in the example embodiment of FIG. 7. Alternatively, system 700 can be implemented in a client-server arrangement wherein at least some functionality associated with these circuits is provided to system 700 using an applet, such as a JavaScript applet, or other downloadable module. Such a remotely accessible module or sub-module can be provisioned in real-time, in response to a request from a client computing system for access to a given server having resources that are of interest to the user of the client computing system. In such embodiments, the server can be local to network 794 or remotely coupled to network 794 by one or more other networks and/or communication channels. In some cases, access to resources on a given network or computing system may require credentials such as usernames, passwords, and/or compliance with any other suitable security mechanism.

In various embodiments, system 700 may be implemented as a wireless system, a wired system, or a combination of both. When implemented as a wireless system, system 700 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, system 700 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the compressive sensing methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 794. In other embodiments, the functionalities disclosed herein can be incorporated into other software applications, such as system monitoring applications. The computer software applications disclosed herein may include any number of different modules, sub-modules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments system 700 may comprise additional, fewer, or alternative subcomponents as compared to those included in the example embodiment of FIG. 7.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CR-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

Example 1 is a method for compressive sensing. The method comprises: sampling, by a processor-based system, data values generated by each of a plurality of sensors in a sensor network; determining, by the processor-based system, a state of the sensor network, based on a calculated statistic of the data values and further based on anomaly indications generated by the sensors; calculating, by the processor-based system, a compressive sensing (CS) sampling schedule based on the determined state and further based on a sparse signal recovery algorithm; broadcasting, by the processor-based system, the CS sampling schedule to the sensors, the CS sampling schedule comprising a sensor identification, a sampling frequency, and a sampling time offset for each of the sensors to be sampled; and updating, by the processor-based system, the state of the sensor network and the CS sampling schedule, based on updated data values generated by the sensors in accordance with the CS sampling schedule.

Example 2 includes the subject matter of Example 1, wherein the sparse signal recovery algorithm performs an L1-norm minimization over a sparse basis.

Example 3 includes the subject matter of Examples 1 or 2, wherein the sparse basis is a Discrete Cosine Transform (DCT).

Example 4 includes the subject matter of any of Examples 1-3, wherein the state of the sensor network is at least one of an equilibrium state, a transient state, and an anomalous state.

Example 5 includes the subject matter of any of Examples 1-4, wherein the equilibrium state is associated with a first subset of the sensors transmitting data values based on the CS schedule, and a second subset of the sensors remaining inactive to conserve power; and wherein the transient state is associated with all of the sensors transmitting data values at a pre-determined rate.

Example 6 includes the subject matter of any of Examples 1-5, wherein the anomalous state is associated with a first subset of the sensors transmitting data values based on the CS schedule, a second subset of the sensors remaining inactive to conserve power, and a third subset of the sensors transmitting data values at a pre-determined rate, the third subset of sensors associated with the anomaly indication.

Example 7 includes the subject matter of any of Examples 1-6, further comprising generating, by the sensors, the anomaly indication based on detection of one of the data values exceeding a selected range of threshold values.

Example 8 includes the subject matter of any of Examples 1-7, wherein the sensor network is a wireless network and the sensors are battery powered.

Example 9 is a network gateway for compressive sensing (CS). The gateway comprises: a state detection circuit to determine a state of a sensor network, based on a calculated statistic of sampled data values generated by one or more sensors in the sensor network, and further based on anomaly indications generated by the one or more sensors; a CS scheduling circuit to calculate a CS sampling schedule based on the determined state and further based on a sparse signal recovery algorithm; a schedule broadcasting circuit to broadcast the CS sampling schedule to the one or more sensors, the CS sampling schedule comprising a sensor identification, a sampling frequency, and a sampling time offset for each of the one or more sensors to be sampled; and the state detection circuit and the CS scheduling circuit further to update the state of the sensor network and the CS sampling schedule, based on updated data values generated by the one or more sensors in accordance with the CS sampling schedule.

Example 10 includes the subject matter of Example 9, wherein the CS scheduling circuit further comprises an L1-norm optimization circuit to execute the sparse signal recovery algorithm based on an L1-norm minimization over a sparse basis.

Example 11 includes the subject matter of Examples 9 or 10, wherein the sparse basis is a Discrete Cosine Transform (DCT).

Example 12 includes the subject matter of any of Examples 9-11, wherein the state of the sensor network is at least one of an equilibrium state, a transient state, and an anomalous state.

Example 13 includes the subject matter of any of Examples 9-12, wherein the equilibrium state is associated with a first subset of the one or more sensors transmitting data values based on the CS schedule, and a second subset of the one or more sensors remaining inactive to conserve power; and wherein the transient state is associated with all of the one or more sensors transmitting data values at a pre-determined rate.

Example 14 includes the subject matter of any of Examples 9-13, wherein the anomalous state is associated with a first subset of the one or more sensors transmitting data values based on the CS schedule, a second subset of the one or more sensors remaining inactive to conserve power, and a third subset of the one or more sensors transmitting data values at a pre-determined rate, the third subset of sensors associated with the anomaly indication.

Example 15 includes the subject matter of any of Examples 9-14, wherein the one or more sensors are to generate the anomaly indication based on detection of one of the data values exceeding a selected range of threshold values.

Example 16 includes the subject matter of any of Examples 9-15, further comprising a sensor sampling circuit to sample the data values generated by the one or more sensors, wherein the sensor network is a wireless network and the one or more sensors are battery powered.

Example 17 is at least one non-transitory computer readable storage medium having instructions encoded thereon that, when executed by one or more processors, result in the following operations for compressive sensing. The operations comprise: determining a state of a sensor network, based on a calculated statistic of sampled data values generated by one or more sensors in the sensor network, and further based on anomaly indications generated by the one or more sensors; calculating a compressive sensing (CS) sampling schedule based on the determined state and further based on a sparse signal recovery algorithm; broadcasting the CS sampling schedule to the one or more sensors, the CS sampling schedule comprising a sensor identification, a sampling frequency, and a sampling time offset for each of the one or more sensors to be sampled; and updating the state of the sensor network and the CS sampling schedule, based on updated data values generated by the one or more sensors in accordance with the CS sampling schedule.

Example 18 includes the subject matter of Example 17, wherein the sparse signal recovery algorithm further comprises the operation of performing an L1-norm minimization over a sparse basis.

Example 19 includes the subject matter of Examples 17 or 18, wherein the sparse basis is a Discrete Cosine Transform (DCT).

Example 20 includes the subject matter of any of Examples 17-19, wherein the state of the sensor network is at least one of an equilibrium state, a transient state, and an anomalous state.

Example 21 includes the subject matter of any of Examples 17-20, wherein the equilibrium state is associated with a first subset of the one or more sensors transmitting data values based on the CS schedule, and a second subset of the one or more sensors remaining inactive to conserve power; and wherein the transient state is associated with all of the one or more sensors transmitting data values at a pre-determined rate.

Example 22 includes the subject matter of any of Examples 17-21, wherein the anomalous state is associated with a first subset of the one or more sensors transmitting data values based on the CS schedule, a second subset of the one or more sensors remaining inactive to conserve power, and a third subset of the one or more sensors transmitting data values at a pre-determined rate, the third subset of sensors associated with the anomaly indication.

Example 23 includes the subject matter of any of Examples 17-22, the operations further comprising generating, by the one or more sensors, the anomaly indication based on detection of one of the data values exceeding a selected range of threshold values.

Example 24 includes the subject matter of any of Examples 17-23, wherein the sensor network is a wireless network and the sensors are battery powered.

Example 25 includes the subject matter of any of Examples 17-24, the operations further comprising sampling the data values generated by each of the one or more sensors.

Example 26 is a system for compressive sensing. The system comprises: means for sampling data values generated by each of a plurality of sensors in a sensor network; means for determining a state of the sensor network, based on a calculated statistic of the data values and further based on anomaly indications generated by the sensors; means for calculating a compressive sensing (CS) sampling schedule based on the determined state and further based on a sparse signal recovery algorithm; means for broadcasting the CS sampling schedule to the sensors, the CS sampling schedule comprising a sensor identification, a sampling frequency, and a sampling time offset for each of the sensors to be sampled; and means for updating the state of the sensor network and the CS sampling schedule, based on updated data values generated by the sensors in accordance with the CS sampling schedule.

Example 27 includes the subject matter of Example 26, wherein the sparse signal recovery algorithm performs an L1-norm minimization over a sparse basis.

Example 28 includes the subject matter of Examples 26 or 27, wherein the sparse basis is a Discrete Cosine Transform (DCT).

Example 29 includes the subject matter of any of Examples 26-28, wherein the state of the sensor network is at least one of an equilibrium state, a transient state, and an anomalous state.

Example 30 includes the subject matter of any of Examples 26-29, wherein the equilibrium state is associated with a first subset of the sensors transmitting data values based on the CS schedule, and a second subset of the sensors remaining inactive to conserve power; and wherein the transient state is associated with all of the sensors transmitting data values at a pre-determined rate.

Example 31 includes the subject matter of any of Examples 26-30, wherein the anomalous state is associated with a first subset of the sensors transmitting data values based on the CS schedule, a second subset of the sensors remaining inactive to conserve power, and a third subset of the sensors transmitting data values at a pre-determined rate, the third subset of sensors associated with the anomaly indication.

Example 32 includes the subject matter of any of Examples 26-31, further comprising means for generating, by the sensors, the anomaly indication based on detection of one of the data values exceeding a selected range of threshold values.

Example 33 includes the subject matter of any of Examples 26-32, wherein the sensor network is a wireless network and the sensors are battery powered.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not be this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A method for compressive sensing, the method comprising:
    sampling, by a processor-based system, data values generated by each of a plurality of sensors in a sensor network;
    determining, by the processor-based system, a state of the sensor network, based on a calculated statistic of the data values and further based on anomaly indications generated by the sensors;
    calculating, by the processor-based system, a compressive sensing (CS) sampling schedule based on the determined state and further based on a sparse signal recovery algorithm;
    broadcasting, by the processor-based system, the CS sampling schedule to the sensors, the CS sampling schedule comprising a sensor identification, a sampling frequency, and a sampling time offset for each of the sensors to be sampled; and
    updating, by the processor-based system, the state of the sensor network and the CS sampling schedule, based on updated data values generated by the sensors in accordance with the CS sampling schedule.

2. The method of claim 1, wherein the sparse signal recovery algorithm performs an L1-norm minimization over a sparse basis.

3. The method of claim 2, wherein the sparse basis is a Discrete Cosine Transform (DCT).

4. The method of claim 1, wherein the state of the sensor network is at least one of an equilibrium state, a transient state, and an anomalous state.

5. The method of claim 4, wherein the equilibrium state is associated with a first subset of the sensors transmitting data values based on the CS schedule, and a second subset of the sensors remaining inactive to conserve power; and wherein the transient state is associated with all of the sensors transmitting data values at a pre-determined rate.

6. The method of claim 4, wherein the anomalous state is associated with a first subset of the sensors transmitting data values based on the CS schedule, a second subset of the sensors remaining inactive to conserve power, and a third subset of the sensors transmitting data values at a pre-determined rate, the third subset of sensors associated with the anomaly indication.

7. The method of claim 1, further comprising generating, by the sensors, the anomaly indication based on detection of one of the data values exceeding a selected range of threshold values.

8. The method of claim 1, wherein the sensor network is a wireless network and the sensors are battery powered.

9. A network gateway for compressive sensing (CS), the gateway comprising:
    a state detection circuit to determine a state of a sensor network, based on a calculated statistic of sampled data values generated by one or more sensors in the sensor network, and further based on anomaly indications generated by the one or more sensors;
    a CS scheduling circuit to calculate a CS sampling schedule based on the determined state and further based on a sparse signal recovery algorithm;
    a schedule broadcasting circuit to broadcast the CS sampling schedule to the one or more sensors, the CS sampling schedule comprising a sensor identification, a sampling frequency, and a sampling time offset for each of the one or more sensors to be sampled; and
    the state detection circuit and the CS scheduling circuit further to update the state of the sensor network and the CS sampling schedule, based on updated data values generated by the one or more sensors in accordance with the CS sampling schedule.

10. The network gateway of claim 9, wherein the CS scheduling circuit further comprises an L1-norm optimization circuit to execute the sparse signal recovery algorithm based on an L1-norm minimization over a sparse basis.

11. The network gateway of claim 10, wherein the sparse basis is a Discrete Cosine Transform (DCT).

12. The network gateway of claim 9, wherein the state of the sensor network is at least one of an equilibrium state, a transient state, and an anomalous state.

13. The network gateway of claim 12, wherein the equilibrium state is associated with a first subset of the one or more sensors transmitting data values based on the CS schedule, and a second subset of the one or more sensors remaining inactive to conserve power; and wherein the transient state is associated with all of the one or more sensors transmitting data values at a pre-determined rate.

14. The network gateway of claim 12, wherein the anomalous state is associated with a first subset of the one or more sensors transmitting data values based on the CS schedule, a second subset of the one or more sensors remaining inactive to conserve power, and a third subset of the one or more sensors transmitting data values at a pre-determined rate, the third subset of sensors associated with the anomaly indication.

15. The network gateway of claim 9, wherein the one or more sensors are to generate the anomaly indication based on detection of one of the data values exceeding a selected range of threshold values.

16. The network gateway of claim 9, further comprising a sensor sampling circuit to sample the data values generated by the one or more sensors, wherein the sensor network is a wireless network and the one or more sensors are battery powered.

17. At least one non-transitory computer readable storage medium having instructions encoded thereon that, when executed by one or more processors, result in the following operations for compressive sensing, the operations comprising:

determining a state of a sensor network, based on a calculated statistic of sampled data values generated by one or more sensors in the sensor network, and further based on anomaly indications generated by the one or more sensors;

calculating a compressive sensing (CS) sampling schedule based on the determined state and further based on a sparse signal recovery algorithm;

broadcasting the CS sampling schedule to the one or more sensors, the CS sampling schedule comprising a sensor identification, a sampling frequency, and a sampling time offset for each of the one or more sensors to be sampled; and updating the state of the sensor network and the CS sampling schedule, based on updated data values generated by the one or more sensors in accordance with the CS sampling schedule.

18. The computer readable storage medium of claim 17, wherein the sparse signal recovery algorithm further comprises the operation of performing an L1-norm minimization over a sparse basis.

19. The computer readable storage medium of claim 18, wherein the sparse basis is a Discrete Cosine Transform (DCT).

20. The computer readable storage medium of claim 17, wherein the state of the sensor network is at least one of an equilibrium state, a transient state, and an anomalous state.

21. The computer readable storage medium of claim 20, wherein the equilibrium state is associated with a first subset of the one or more sensors transmitting data values based on the CS schedule, and a second subset of the one or more sensors remaining inactive to conserve power; and wherein the transient state is associated with all of the one or more sensors transmitting data values at a pre-determined rate.

22. The computer readable storage medium of claim 20, wherein the anomalous state is associated with a first subset of the one or more sensors transmitting data values based on the CS schedule, a second subset of the one or more sensors remaining inactive to conserve power, and a third subset of the one or more sensors transmitting data values at a pre-determined rate, the third subset of sensors associated with the anomaly indication.

23. The computer readable storage medium of claim 17, the operations further comprising generating, by the one or more sensors, the anomaly indication based on detection of one of the data values exceeding a selected range of threshold values.

24. The computer readable storage medium of claim 17, wherein the sensor network is a wireless network and the sensors are battery powered.

25. The computer readable storage medium of claim 17, the operations further comprising sampling the data values generated by each of the one or more sensors.

* * * * *